(12) United States Patent
Guo et al.

(10) Patent No.: US 10,515,167 B2
(45) Date of Patent: Dec. 24, 2019

(54) CELL-AWARE DEFECT CHARACTERIZATION AND WAVEFORM ANALYSIS USING MULTIPLE STROBE POINTS

(71) Applicant: Synopsys, Inc., Mountain View, CA (US)

(72) Inventors: Ruifeng Guo, Portland, OR (US); Brian Matthew Archer, Mountain View, CA (US); William Albert Lloyd, Beaverton, OR (US); Christopher Kevin Allsup, Sunnyvale, CA (US); Xiaolei Cai, Portland, OR (US); Kevin Chau, San Jose, CA (US)

(73) Assignee: SYNOPSYS, INC., Mountain View, CA (US)

( * ) Notice: Subject to any disclaimer, the term of this patent is extended or adjusted under 35 U.S.C. 154(b) by 456 days.

(21) Appl. No.: 15/230,079

(22) Filed: Aug. 5, 2016

(65) Prior Publication Data

US 2018/0039721 A1 Feb. 8, 2018

(51) Int. Cl.
*G06F 17/50* (2006.01)

(52) U.S. Cl.
CPC ...... *G06F 17/5036* (2013.01); *G06F 17/5081* (2013.01); *Y02E 60/76* (2013.01); *Y04S 40/22* (2013.01)

(58) Field of Classification Search
CPC ............. G06F 17/5022; G06F 17/5045; G01R 31/318583; G01R 31/318307
USPC .......................................................... 703/21
See application file for complete search history.

(56) References Cited

U.S. PATENT DOCUMENTS

| 6,247,165 | B1 | 6/2001 | Wohl et al. |
| 7,673,260 | B2 | 3/2010 | Chen et al. |
| 8,683,400 | B1 | 3/2014 | O'Riordan et al. |

FOREIGN PATENT DOCUMENTS

| TW | 201323896 A | 6/2013 |
| TW | 201329762 A | 6/2013 |

OTHER PUBLICATIONS

Debany, "Digital Logic Testing and Testability", Rome Laboratory Air Force Systems Command Griffiss Air Force Base, NY 13441-5700 (Year: 1991).*
Jin-Fu Li, Chapter 4 Fault Simulation, Advanced Reliable Systems (ARES) Lab. Department of Electrical Engineering National Central University 2009 (Year: 2009).*

(Continued)

*Primary Examiner* — Brian S Cook
(74) *Attorney, Agent, or Firm* — Alston & Bird LLP

(57) ABSTRACT

A computer-implemented method for characterizing a circuit is presented. The method includes receiving, by the computer, data representative of the circuit and at least one defect of the circuit. The method further includes simulating, using the computer, the circuit to obtain a first timing characteristic, and simulating, using the computer, the circuit with the at least one defect to obtain a second timing characteristic. The method further includes identifying, using the computer, an association between at least one test vector and the at least one defect in accordance with the first timing characteristic, the second timing characteristic, and a multitude of strobes applied during a first time interval associated with the at least one test vector, when the computer is invoked to characterize the circuit.

57 Claims, 11 Drawing Sheets

(56) References Cited

OTHER PUBLICATIONS

Liao_1996 (Y. Liao, D. M. H. Walker, "Optimal Voltage Testing for Physically-Based Faults", VLSI Test Symp., pp. 344-353, 1996).*
Liao_1996 (Y. Liao, D. M. H. Walker, "Optimal Voltage Testing for Physically-Based Faults", VLSI Test Symp., pp. 344-353, 1996). (Year: 1996).*
Amyeen et al., "Improving Precision Using Mixed-Level Fault Diagnosis," IEEE, International Test Conference, Paper 22.3, pp. 1-10, (2006).
Brown et al., "Automated Standard Cell Library Analysis for Improved Defect Modeling," IEEE Computer Society, 9th International Symposium on Quality Electronic Design, pp. 643-648, (2008).
Desineni et al., "A Logic Diagnosis Methodology for Improved Localization and Extraction of Accurate Defect Behavior," IEEE, International Test Conference, Paper 12.3, pp. 1-10, (2006).
Fan et al., "Diagnosis of Cell Internal Defects With Multi-Cycle Test Patterns," IEEE Computer Society, 21st Asian Test Symposium, pp. 7-12, (2012).
Guo et al., "Detection and Diagnosis of Static Scan Cell Internal Defect," IEEE, International Test Conference, Paper 17.2, pp. 1-10, (2008).
Hapke et al., "Cell-Aware Analysis for Small-Delay Effects and Production Test Results from Different Fault Models," IEEE, International Test Conference, Paper 9.1, pp. 1-8, (2011).
Hapke et al., "Cell-Aware Production Test Results from a 32-nm Notebook Processor," IEEE, International Test Conference, Paper 1.1, pp. 1-9, (2012).
Hapke et al., "Cell-Aware Test," IEEE Transactions on Computer Aided Design of Integrated Circuits and Systems, vol. 33, No. 9, pp. 1396-1409, (Sep. 2014).
Hapke et al., "Defect-Oriented Cell-Aware ATPG and Fault Simulation for Industrial Cell Libraries and Designs," IEEE, International Test Conference, Paper 1.2, pp. 1-10, (2009).
Hapke et al., "Defect-Oriented Cell-Internal Testing," IEEE, International Test Conference, Paper 10.1, pp. 1-10, (2010).
Hapke et al., "Introduction to the Defect-Oriented Cell-Aware Test Methodology for Significant Reduction of DPPM Rates," IEEE Computer Society, 17th IEEE European Test Symposium (ETS), 6 pages, (2012).
Ladhar et al., "Efficient and Accurate Method for Intra-Gate Defect Diagnosis in Nanometer Technology and Volume Date," EDAA, 6 pages, (2009).
Ladhar et al., "Extraction and Simulation of Potential Bridging Faults and Open Defects Affecting Standard Cell Libraries," IEEE, International Conference on Signals, Circuits and Systems, pp. 1-6, (2008).
Ladhar et al., "Layout Based Method to Diagnosis Intra-Gate Defects in Presence of Multiple-Fault," IEEE, International Conference on Signals, Circuits and Systems, pp. 1-6, (2008).
Sharma et al., "Faster Defect Localization in Nanometer Technology Based on Defective Cell Diagnosis," IEEE, International Test Conference, Paper 15.3, pp. 1-10, (2007).
Yang et al., "Silicon Evaluatin of Cell-Aware ATPG Tests amd Small Delay Tests," IEEE Computer Society, 23rd Asian Test Symposium, pp. 101-106, (2014).
Debany, "Digital Logic Testing and Testability," Rome Laboratory In House Report, RL-TR-91-6, Feb. 1991.
Li, "Chapter 4, Fault Simulation," Advanced Relioable Systems (ARES) Lab., availabe http://www.ee.ncu.edu.tw/~jfli/test1/lecture/ch04, Mar. 26, 2011.
TW Application No. 106125087 1st Office Action dated Dec. 13, 2018.

* cited by examiner

CELL-AWARE DEFECT CHARACTERIZATION AND WAVEFORM ANALYSIS USING MULTIPLE STROBE POINTS

BACKGROUND

The present disclosure relates generally to characterizing circuit defects, and more specifically to automatically characterizing circuit defects using a multitude of strobes during standard cell characterization.

Complex integrated circuit (IC) designs may be put together from a multitude of instantiations of simpler circuits called standard cells from a standard cell library. Standard cells may be electrically characterized at the transistor level using electronic design automation (EDA) software tools such as SPICE to predict the performance of output signal response to input signal transitions on inputs of the standard cells. However, logic level simulation tools are used instead of transistor level characterization when circuits are too complex due to longer simulation times and/or solution convergence problems with transistor level simulation.

Feature sizes on IC designs have continued to decrease and the complexity of process technology has continued to increase according to Moore's Law, which in-turn makes acceptable IC manufacturing yields harder to achieve due to manufacturing defects. Therefore, predicting and/or characterizing the sometimes subtle effects of different types of defects on complex IC performance has become ever more important.

SUMMARY

According to one embodiment of the present invention, a computer-implemented method for characterizing a circuit is presented. The method includes receiving, by the computer, data representative of the circuit and at least one defect of the circuit. The method further includes simulating, using the computer, the circuit to obtain a first timing characteristic, and simulating, using the computer, the circuit with the at least one defect to obtain a second timing characteristic. The method further includes identifying, using the computer, an association between at least one test vector and the at least one defect in accordance with the first timing characteristic, the second timing characteristic, and a multitude of strobes applied during a first time interval associated with the at least one test vector, when the computer is invoked to characterize the circuit.

According to one embodiment, the computer-implemented method further includes comparing the first timing characteristic with the second timing characteristic using the at least one test vector.

According to one embodiment, identifying further includes determining if the second timing characteristic is substantially static during each of the multitude of strobes. According to one embodiment, identifying further includes determining if the second timing characteristic includes a first transition that occurs after a second transition of the first timing characteristic.

According to one embodiment, identifying further includes determining if the second timing characteristic includes a first transition that occurs before a second transition of the first timing characteristic. According to one embodiment, identifying further includes determining if the second timing characteristic is a timing error. According to one embodiment, identifying further includes determining if the second timing characteristic is a static error or a dynamic error when the second timing characteristic is determined to be a timing error.

According to one embodiment, receiving includes generating, using the computer, the data representative of the at least one defect in accordance with data representative of at least one element of the circuit. According to one embodiment, the data representative of the at least one defect is received using an input device of the computer. According to one embodiment, the circuit is one cell of a library of a multitude of cells.

According to one embodiment, receiving includes extracting from a data file at least one value associated with at least one parameter used for initializing the circuit simulation used to obtain the first timing characteristic or the second timing characteristic. According to one embodiment, identifying further includes determining a difference in time associated with the multitude of strobes, the first timing characteristic, and the second timing characteristic.

According to one embodiment, the multitude of strobes includes a first strobe associated with a first transition of the first timing characteristic and a second strobe associated with a second transition of the second timing characteristic. According to one embodiment, identifying further includes associating a value of a parameter that characterizes the at least one defect in accordance with a difference in time associated with the multitude of strobes. According to one embodiment, the difference in time is equal to the difference between a first time associated with the first strobe and a second time associated with the second strobe.

According to one embodiment, receiving includes generating a first multitude of test vectors, wherein the at least one test vector is included in the first multitude of test vectors enumerated by a first number that is smaller than a second number that enumerates a second multitude of test vectors including at least one adjacent pair of test vectors characterized by having a signal transition for more than one of a multitude of input signals of the circuit at a time.

According to one embodiment, the first multitude of test vectors includes every combination of an adjacent pair of test vectors characterized by having a signal transition for one input of a multitude of input signals of the circuit at a time. According to one embodiment, the first multitude of test vectors does not include an adjacent pair of test vectors characterized by having a signal transition for more than one of a multitude of input signals of the circuit at a time. According to one embodiment, identifying further includes identifying, during a single pass through the computer-implemented method in accordance with a first multitude of test vectors that include the at least one test vector, an error selected from the group consisting of a static error and a dynamic error.

According to one embodiment of the present invention, a non-transitory computer-readable storage medium including instructions, which when executed by a computer, cause the computer to receive data representative of the circuit and at least one defect of the circuit, simulate the circuit to obtain a first timing characteristic, and simulate the circuit with the at least one defect to obtain a second timing characteristic. The instructions further cause the computer to identify an association between at least one test vector and the at least one defect in accordance with the first timing characteristic, the second timing characteristic, and a multitude of strobes applied during a first time interval associated with the at least one test vector, when the computer is invoked to characterize the circuit.

According to one embodiment, the instructions further cause the computer to compare the first timing characteristic with the second timing characteristic using the at least one test vector.

According to one embodiment of the present invention, a computer system is operative to receive data representative of the circuit and at least one defect of the circuit, simulate the circuit to obtain a first timing characteristic, and simulate the circuit with the at least one defect to obtain a second timing characteristic. The computer system is further operative to identify an association between at least one test vector and the at least one defect in accordance with the first timing characteristic, the second timing characteristic, and a multitude of strobes applied during a first time interval associated with the at least one test vector, when the computer system is invoked to characterize the circuit.

According to one embodiment, the computer system is further operative to compare the first timing characteristic with the second timing characteristic using the at least one test vector.

A better understanding of the nature and advantages of the embodiments of the present invention may be gained with reference to the following detailed description and the accompanying drawings.

DETAILED DESCRIPTION

Figure 1:
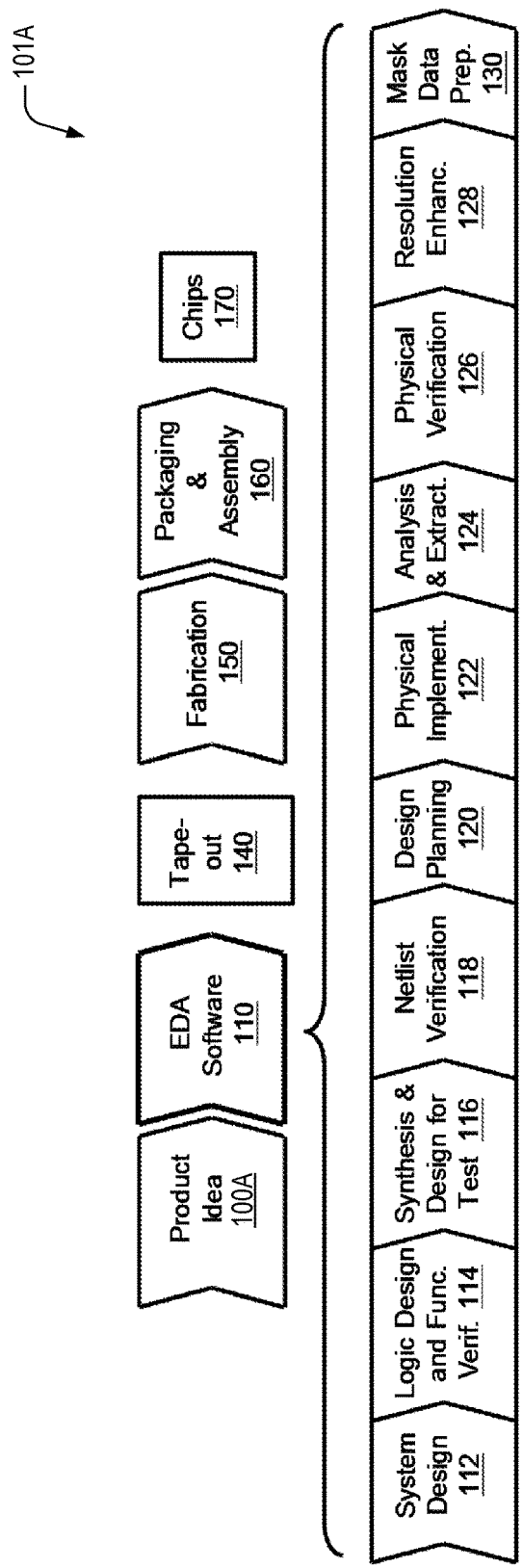
FIG. 1 depicts simplified exemplary steps in the design and fabrication of an integrated circuit, which may use embodiments of the present invention.

FIG. 1 depicts various steps 101A in the design and fabrication of an integrated circuit. The process starts with a product idea 100A, which may be realized using Electronic Design Automation (EDA) software 110. Chips 170 can be produced from the finalized design by performing fabrication 150 and packaging and assembly 160 steps. An exemplary design flow that uses EDA software 110 is described below for illustration purposes only. For example, an actual integrated circuit design may require a designer to perform the design flow steps in a different sequence than the sequence described below.

In the system design 112, a designer describes the functionality to be implemented. The designer can also perform what-if planning to refine the functionality and to check costs. Further, hardware-software architecture partitioning can occur at this step. In the design and functional verification 114, a Hardware Description Language (HDL) design may be created and checked for functional accuracy.

In the synthesis and design 116, the HDL code can be translated to a netlist, which can be optimized for the target technology. Further, tests may be designed and implemented to check the finished chips. In the netlist verification 118, the netlist may be checked for compliance with timing constraints and for correspondence with the HDL code. In the design planning 120, an overall floor plan for the chip can be constructed and analyzed for timing and top-level routing. Next, in the physical implementation 122, placement and routing may be performed.

In the analysis and extraction 124, the circuit functionality may be verified at a transistor level. In the physical verification 126, the design may be checked to correct any functional, manufacturing, electrical, or lithographic issues. In the resolution enhancement 128, geometric manipulations may be performed on the layout to improve manufacturability of the design. Finally, in the mask data preparation 130, the design can be taped-out 140 for production of masks to produce finished chips. A dual-patterning process technology (DPT) or multi-patterning process technology (MPT) lithography process may be used to print complex design intents or shapes on a single layer of an IC process using two or more separate masks with higher pattern density than the pattern density provided by using a single mask photolithographic printing process. The embodiments of the present invention may be used, for example at the steps of either physical verification 126, test pattern generation, logic diagnosis, or failure isolation and yield improvement.

Defects are able to be characterized using transistor level characterization on standard cells. The results of the transistor level characterization of defects in standard cells may be transferred to a logic level simulator with the use of so called cell-aware defect characterization to create a cell-aware logic test model. The cell-aware logic test model may then be used by a test pattern generation tool for test pattern generation and/or may be used by a fault diagnosis tool to identify the presence of a certain type of defect in the complex IC chip. However, existing cell-aware defect characterization has produced limited accuracy with regard to the effects of defects of different severity and with regard to timing accuracy as will be demonstrated in the examples below. Further, existing cell aware defect characterization requires two separate simulation passes to separately deal with static and dynamic defect characterization requiring considerable computing resources. Therefore, it is desirable to improve the accuracy of cell-aware defect characterization while also reducing the computing resource required for this characterization.

Figure 2:
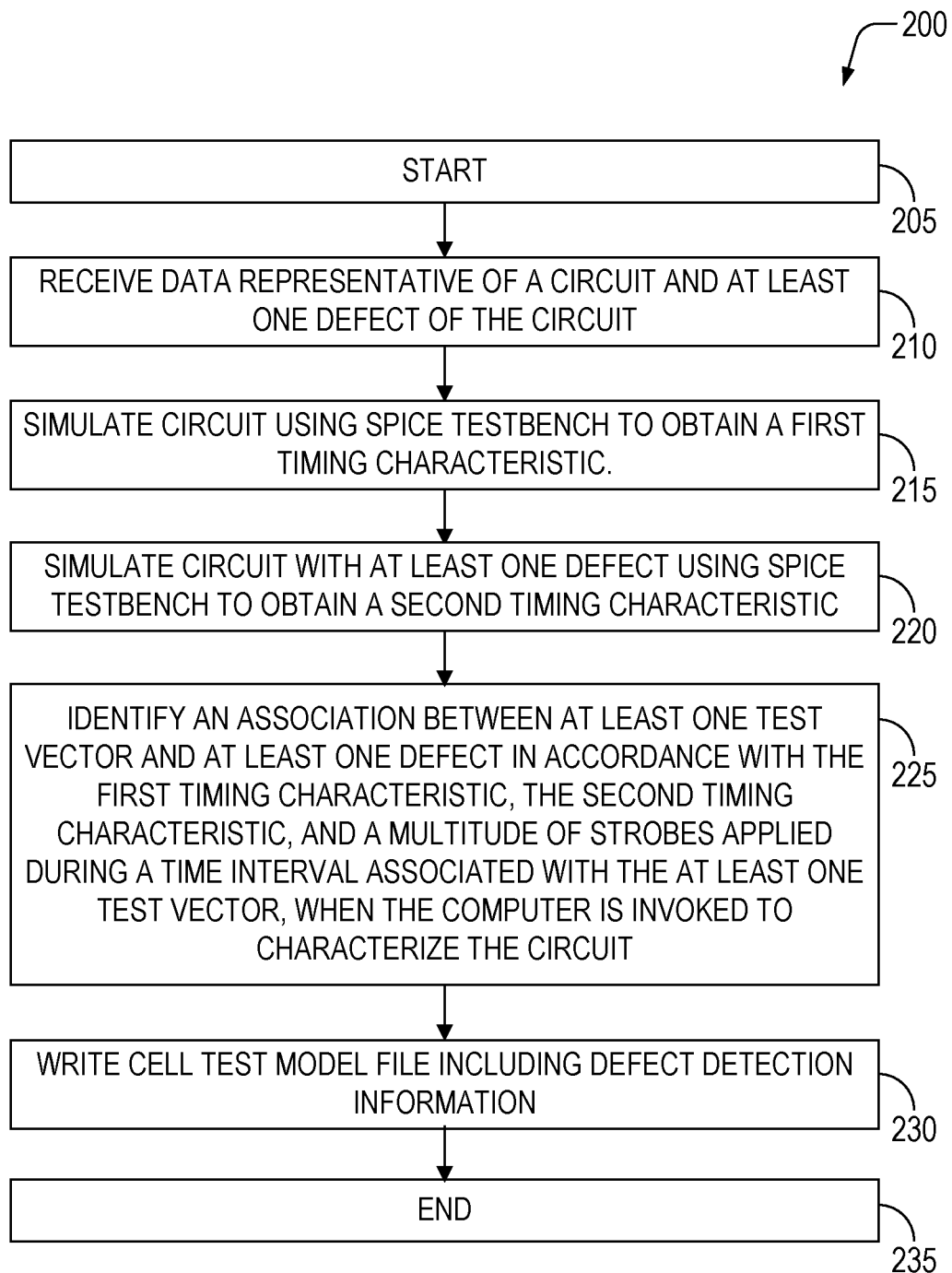
FIG. 2 depicts a simplified exemplary flowchart of a computer-implemented method for characterizing a circuit, in accordance with one embodiment of the present invention.

In accordance with embodiments of the present invention, an automated technique is presented that uses a multitude of strobes to improve the accuracy of cell-aware defect characterization, while analyzing both static and dynamic circuit timing errors caused by manufacturing defects during one simulation pass. FIG. 2 depicts an exemplary high level flowchart of a computer-implemented method 200 for characterizing a circuit, in accordance with one embodiment of the present invention. The computer-implemented method 200 starts 205 with receiving 210 data representative of the circuit and at least one defect of the circuit. The circuit is simulated 215 without any defects using a SPICE testbench to obtain a timing characteristic representing the output signal of the circuit without any defects, hereinafter also referred to as the "good circuit," using a multitude of strobe points. The circuit is simulated 220 with at least one defect using the SPICE testbench to obtain a timing characteristic representing the output signal of the circuit with the defect, hereinafter also referred to as the "defect-injected circuit," using a multitude of strobe points. The steps of simulating the circuit without and with the defect may be performed in any order or may be performed in parallel. Details will also be presented that explain how to characterize a multitude of defects of different types.

Next, computer-implemented method 200 identifies 225 an association between at least one test vector for logic level simulation and the at least one defect in accordance with the transistor level timing characteristic for the good circuit, the transistor level timing characteristic for the defective circuit, and a multitude of strobes applied during a time interval associated with the at least one test vector, when the computer is invoked to characterize the circuit, as will be explained in greater detail below. Then the results of the identification step are used to write 230 a write cell test model (CTM) file that includes the defect detection information. After the end 235 of the method, the CTM file may be used as an input to a logic level simulation tool to simulate a complex IC's logic and timing behavior under the influence of the defect or a multitude of defects as explained below.

Figure 3:
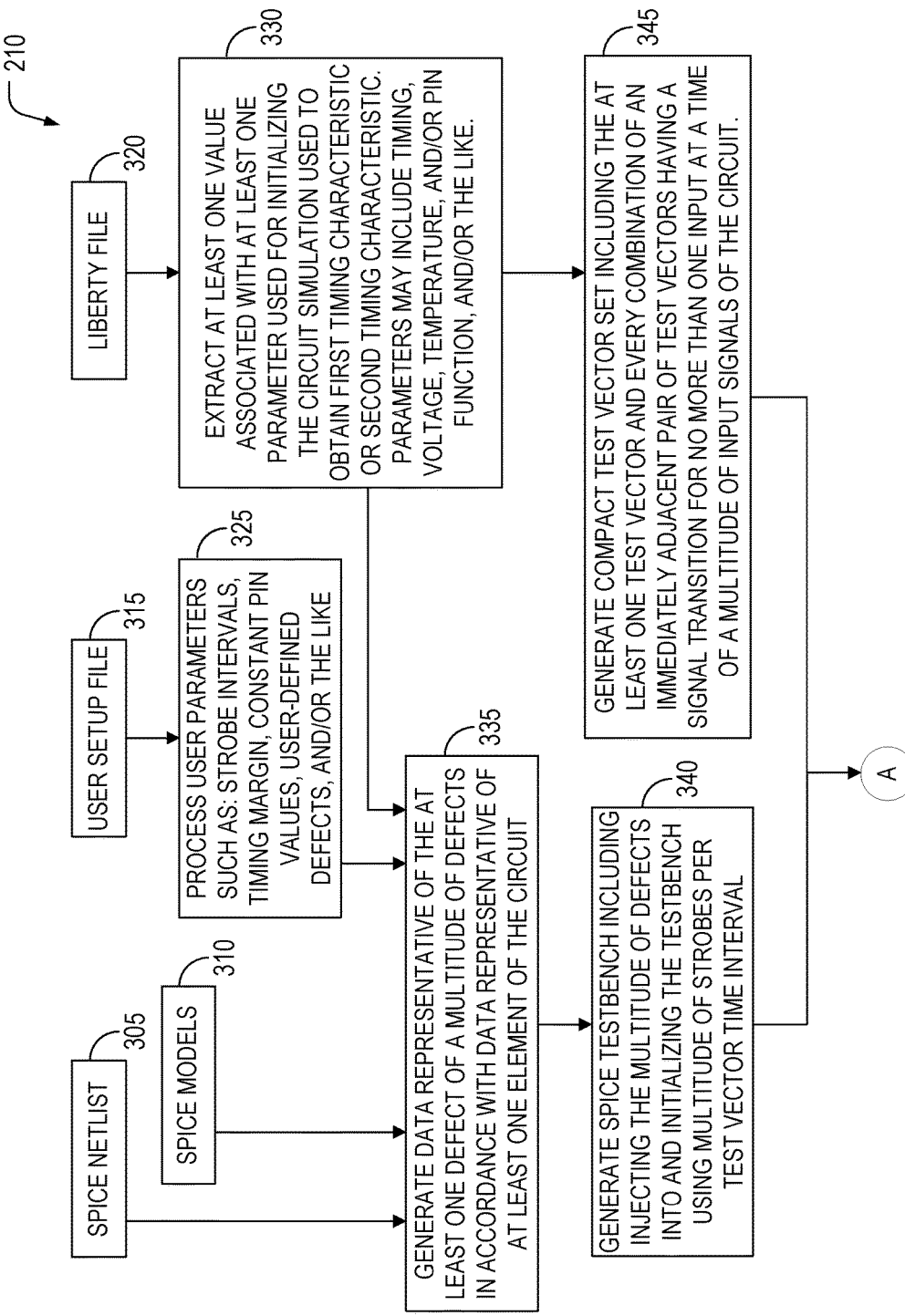
FIG. 3 depicts an exemplary flowchart for the step of receiving data of the computer-implemented method as depicted in FIG. 2, in accordance with one embodiment of the present invention.

FIG. 3 depicts an exemplary flowchart for the step of receiving 210 data of the computer-implemented method 200 as depicted in FIG. 2, in accordance with one embodiment of the present invention. The step of receiving 210 data includes receiving the SPICE netlist 305 and SPICE models 310 enabling the circuit to later be simulated and characterized at the transistor level.

FIG. 4A depicts data representing an exemplary schematic of a good circuit 400A, which may use embodiments of the present invention, and which may be specified by the SPICE netlist 305 and SPICE models 310 depicted in FIG. 3. In one embodiment, good circuit 400A may be a cell of a standard cell library. In another embodiment, good circuit 400A may be one cell of a library of a multitude of cells, such as for example any digital library cell and not just standard cells. For example, the good circuit may be a memory circuit that may be characterized for defects. In one example, good circuit 400A functions as a simple two input logical AND gate commonly found in a standard cell library. Good circuit 400A may include PMOS transistors 405, 410, 425, and NMOS transistors 415, 420, 430. PMOS transistors 405, 410 both have their sources connected to Vdd, and both have their drains connected to a node B, which in turn is connected to the gates of CMOS inverter connected PMOS transistor 425 and NMOS transistor 430. NMOS transistors 415, 420 are connected in a stack that is able to conduct current between node B and GND. Input A1 is connected to the gates of PMOS transistor 405 and NMOS transistor 415. Input A2 is connected to the gates of PMOS transistor 410 and NMOS transistor 420. The output X is driven by the CMOS inverter connected PMOS transistor 425 and NMOS transistor 430.

Whenever either input A1 or input A2 is at a logic low level or whenever both inputs are low, then one or both of the NMOS transistors 415, 420 is off and one of the PMOS transistors 405, 410 is on pulling node B close to Vdd and causing the CMOS inverter connected PMOS transistor 425 and NMOS transistor 430 to drive output X towards GND or a logic low level. Only when both inputs A1 and A2 are at a logic high level do PMOS transistors 405, 410 shut off while NMOS transistors 415, 420 turn on pulling node B close to GND and causing the CMOS inverter to pull output X to a logic high or close to Vdd level and enabling good circuit 400A to correctly function as an AND gate.

Referring again to FIG. 3, receiving 210 data may further include receiving setup files 315 from a user input device of the computer. The setup files may then be processed 325 to obtain user defined parameters such as strobe intervals, timing margin, constant pin values, user-defined defects, and/or the like. In one embodiment, some or all parameters specified in setup files 315 may be provided as predetermined or default values requiring no further input from the user input device of the computer. In one embodiment, data representative of a defect may be received using the user input device of the computer to replace and/or supplement the defect data automatically generated by the computer.

Receiving 210 data may further include receiving initialization data from a so called Liberty file 320, which may be used to extract 330 at least one value associated with at least one parameter used for later initializing the circuit simulation used to obtain the timing characteristics for the good circuit and the defect-injected circuit. Parameters may include any combination of the following parameters; timing, voltage, temperature, load capacitance, clock edge activation type such as positive or negative edge, type of cell such as combinational logic, latch, and/or flip-flop cell, and/or pin function of the circuit such as clock, input/output, power, or ground pins.

Figure 4:
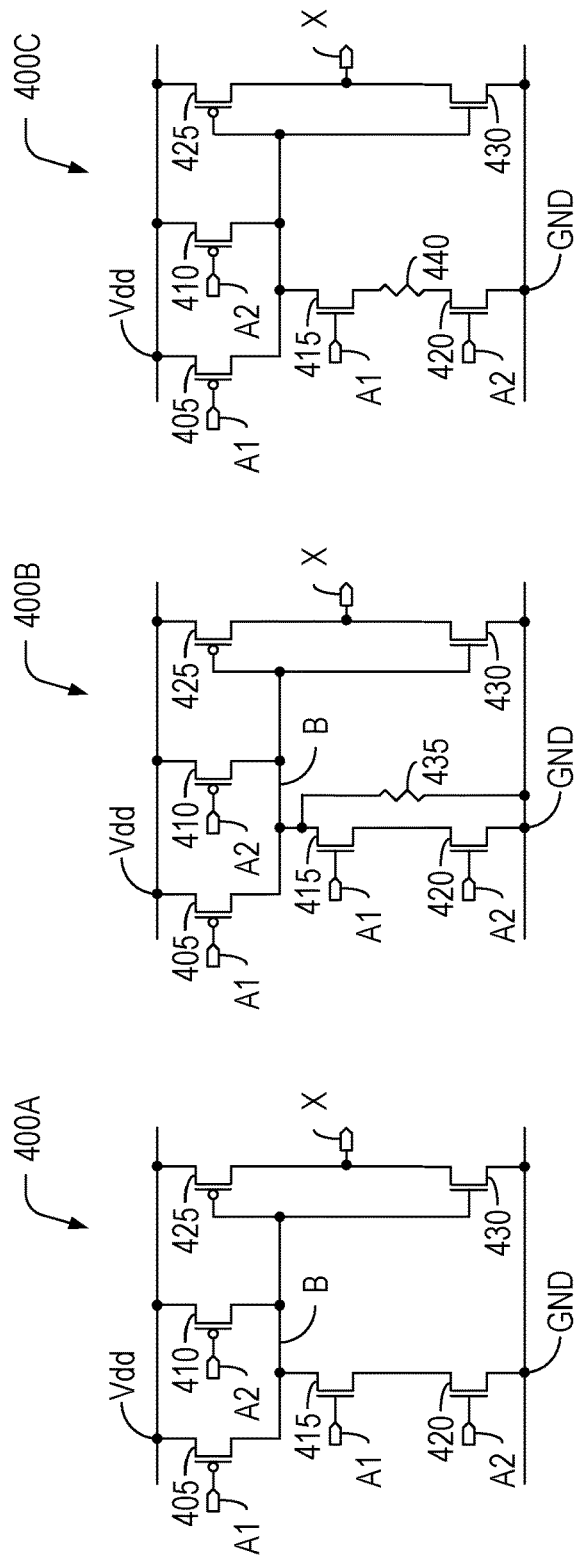
FIG. 4A depicts data representing an exemplary schematic of a good circuit, which may use embodiments of the present invention.
FIG. 4B depicts data representing an exemplary schematic of a short type of defect injected into the good circuit depicted in FIG. 4A to form one defect-injected circuit, in accordance with one embodiment of the present invention.
FIG. 4C depicts data representing an exemplary schematic of an open type of defect injected into the good circuit depicted in FIG. 4A to form another defect-injected circuit, in accordance with one embodiment of the present invention.
Figure 5:
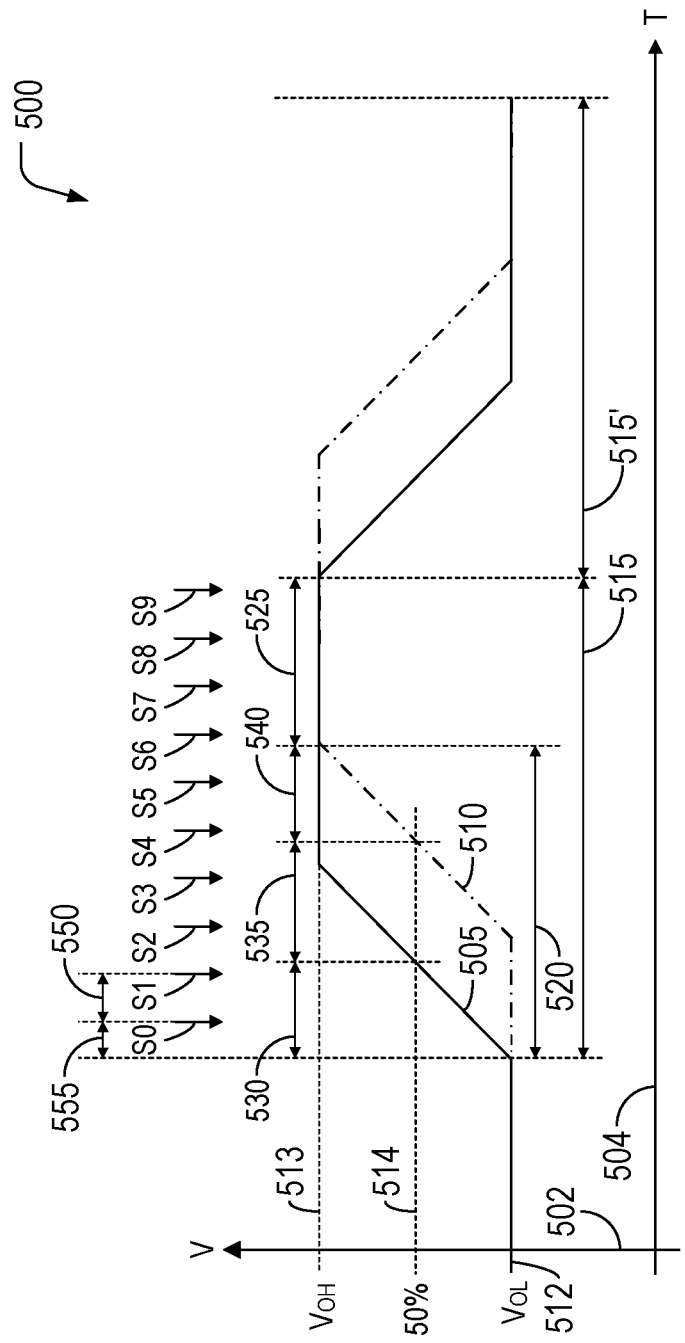
FIG. 5 depicts a simplified exemplary timing diagram in accordance with parameters extracted from the Liberty file depicted in FIG. 3, in accordance with one embodiment of the present invention.

FIG. 5 depicts a simplified exemplary timing diagram 500 in accordance with parameters extracted from the Liberty file 320 depicted in FIG. 3, in accordance with one embodiment of the present invention. Referring to FIGS. 3, 4, and 5, timing diagram 500 depicts the voltage value, V, of an input signal along the vertical axis 502 as a function of time, T, which is depicted along the horizontal axis 504.

Timing diagram 500 further depicts by a solid line a transition 505 of an input signal, such as A1 of good circuit 400A, driven from a logic low voltage level, $V_{OL}$ 512, to a logic high voltage level, $V_{OH}$ 513, where the values for parameters $V_{OL}$ 512 and $V_{OH}$ 513 may be extracted 330 from Liberty file 320. In this example, Liberty file 320 specifies logic level transitions to take place at an input voltage level simply half-way or 50% 514 between $V_{OL}$ 512 and $V_{OH}$ 513, however in other embodiments, separate $V_{IL}$ and $V_{IH}$ voltage values may be alternatively specified for logic level transition levels.

Transition 505 may be associated with a pair of logical test vector inputs specified as "0, 1" or "0 to 1", where a vector time interval 515, hereinafter also referred to as a "vector interval", is associated with one input test vector, such as "1". Liberty file 320 may further specify vector interval 515, which includes a ".lib clock" time interval 520 followed consecutively by a timing margin time interval 525. ".lib clock" time interval 520 may include an input slew time interval 530, followed consecutively by a cell delay time interval 535, and a transition time interval 540, which may also be specified by Liberty file 320.

Vector interval 515, ".lib clock" time interval 520, and input slew time interval 530 may all start at the beginning of the rise of transition 505. Input slew time interval 530 ends when transition 505 reaches 50% 514 voltage level at which time may begin cell delay time interval 535. Cell delay time interval 535 may end when an output timing characteristic 510 of good circuit 400A reaches 50% 514 voltage level at which time begins transition time interval 540. ".lib clock" time interval 520 and transition time interval 540 may end when output timing characteristic 510 reaches high voltage level, $V_{OH}$ 513 at which time begins timing margin time interval 525.

Vector interval 515 and timing margin time interval 525 both end when the next transition of input signal A1 may begin. For example, the next vector interval 515' may begin as depicted when input signal A1 may be driven from $V_{OH}$ 513 to $V_{OL}$ 512. The next vector interval 515' may be associated with another pair of logical test vector inputs specified as "1, 0" or "1 to 0" as depicted in this example. In one embodiment, the definitions for the falling transition may be specified by Liberty file 320 analogously as described above for the rising transition or, in an alternative embodiment, may be specified in Liberty file 320 by different parameters than the rising transition.

It is understood that there are many possible standard cell circuit types, which may use different parameter values specified in Liberty file 320 due for instance to standard cells that may operate in different voltage domains or different clock timing requirements, to name just a few reasons. Therefore the use of Liberty file 320 to provide the many and varied initialization parameters for transistor level simulation may greatly simplify and prevent errors during cell-aware defect characterization.

Referring again to FIG. 3, receiving 210 data may further include using the SPICE netlist 305, SPICE models 310, processed 325 parameters received from a user input device, and the at least one extracted 330 parameter from the Liberty file 320 to generate 335 data representative of the at least one defect of a multitude of defects in accordance with data representative of at least one element of good circuit 400A. In one embodiment, if circuit element size is not to be considered, then good circuit 400A includes in this example two types of elements; NMOS transistors and PMOS transistors. In one embodiment, each transistor type may be associated with a different multitude of defect types. It is understood that other defect types may be associated with non-transistor type circuit elements such as metal shorts or metal opens for example.

In one embodiment, for each type of transistor element, data representative of the multitude of defects listed in table 1 may be generated in the step generate 335 data. The nine transistor related defects listed in Table 1, which may not be an exhaustive listing of all transistor related defects, demonstrate that there are many ways defects may manifest themselves even for just one circuit element type. Therefore the number of combinations where one or more defects at a time may be injected into a good circuit may be very large even for the simple example of good circuit 400A, which makes automated defect generation and injection desirable to better characterize the effect of defects on standard cells. In an alternative embodiment, one or more of the multitude of defects may be provided via the user input device.

TABLE 1

Drain to gate short
Source to gate short
Drain to source short
Drain to bulk short
Source to bulk short
Gate to bulk short
Gate open
Source open
Drain open Referring again to FIGS. 3 and 5, receiving 210 data may further include generating 340 a SPICE testbench including injecting one or more of the multitude of defects listed in table 1 into and initializing the SPICE testbench using the multitude of strobes S0-S9 per test vector time interval 515 to form a defect-injected circuit. In one embodiment, a strobe timing interval 550 and/or an initial strobe timing offset 555 may be provided by predetermined default values. In an alternative embodiment, strobe timing interval 550 and/or initial strobe timing offset 555 may be provided via the user input device. Two examples of the possible multitude of defects and their effects on the electrical timing characteristics of good circuit 400A will be described below.

FIG. 4B depicts data representing an exemplary schematic of a short 435 type of defect injected into the good circuit 400A depicted in FIG. 4A to form one defect-injected circuit 400B, in accordance with one embodiment of the present invention. FIG. 4B depicts the same elements and functions as depicted in FIG. 4A with the following exceptions. FIG. 4B depicts defect-injected circuit 400B may include a drain to bulk short 435 type defect as listed above in table 1 injected between the drain of NMOS transistor 415 and GND. (It is understood that the bulk connection of NMOS transistor 415 may be connected to GND.) The data representing short 435 may be characterized by a parameter of resistance that may have for example a value of 10 K ohms. Short 435 may cause an earlier rising transition from $V_{OL}$ to $V_{OH}$ at output X as described below.

FIG. 4C depicts data representing an exemplary schematic of an open 440 type of defect injected into the good circuit 400A depicted in FIG. 4A to form another defect-injected circuit 400C, in accordance with one embodiment of the present invention. FIG. 4C depicts the same elements and functions as depicted in FIG. 4A with the following exceptions. FIG. 4C depicts defect-injected circuit 400C may include a drain open 440 type defect as listed above in table 1 injected in series with the drain of NMOS transistor 420 and connected between the drain of NMOS transistor 420 and the source of NMOS transistor 415. The data representing open 440 may be characterized by a parameter of resistance that may have for example a value of 100 K ohms. Short 435 may cause a delayed rising transition from $V_{OL}$ to $V_{OH}$ at output X as described below.

Referring again to FIGS. 3 and 4A, receiving 210 data may further include generating 345 a compact test vector set including the at least one test vector and including every combination of an immediately adjacent pair of test vectors having a signal transition for no more than one input at a time of a multitude of input signals of good circuit 400A. Table 2 lists an example of a non-compacted test vector set for good circuit 400A. The first column from the left of table 2 lists a vector number for each test vector and enumerates a total of 24 test vectors.

TABLE 2

| Vector number | Input A1 | Input A2 |
|---|---|---|
| 1 | 0 | 0 |
| 2 | 0 | 0 |
| 3 | 0 | 1 |
| 4 | 0 | 0 |
| 5 | 0 | 0 |
| 6 | 1 | 0 |
| 7 | 0 | 1 |
| 8 | 0 | 1 |
| 9 | 0 | 0 |
| 10 | 0 | 1 |
| 11 | 0 | 1 |
| 12 | 1 | 1 |
| 13 | 1 | 0 |
| 14 | 1 | 0 |
| 15 | 1 | 1 |
| 16 | 1 | 0 |
| 17 | 1 | 0 |
| 18 | 0 | 0 |
| 19 | 1 | 1 |
| 20 | 1 | 1 |
| 21 | 0 | 1 |
| 22 | 1 | 1 |
| 23 | 1 | 1 |
| 24 | 1 | 0 |

The second and third columns from the left of table 2 lists the respective logic input values for input A1 and input A2 of good circuit 400A. In this table 2 embodiment, input transitions may occur between some immediately adjacent vector pair such as at vector numbers (2, 3) and (8, 9), while other immediately adjacent vector pairs such as at vector numbers (1, 2) and (7, 8) do not provide any input transition on either input A1 nor input A2 in order to allow the electrical behavior of the circuit to stabilize in order to improve cell-aware defect characterization accuracy.

A signal transition for no more than one input at a time of input signal A1 and input signal A2 of good circuit 400A may be called a "robust transition" such as provided by immediately adjacent vector pairs at vector numbers (2, 3) and (8, 9). Robust transitions are more useful than non-robust transitions because it is more difficult to associate the effect of a particular injected defect on the electrical behavior of the circuit when more than one input of the circuit is changing. The set of all possible robust transitions is desirable to include in the test vector set to fully characterize the effect of the defect on the circuit and are included in table 2 as provided by immediately adjacent vector pairs at vector numbers (2, 3), (5, 6), (8, 9), (11, 12), (14, 15), (17, 18), (20, 21), and (23, 24).

Although the non-compacted test vector set listed in table 2 includes all robust transitions and provides stabilization periods for better characterization. However, the non-compacted test vector set also includes a multitude of non-robust transitions such as provided by immediately adjacent vector pairs at vector numbers (6, 7) and (18, 19). Therefore, the non-compacted test vector set contains test vectors that are extra or undesired. In other words, the multitude of non-compacted test vectors include at least one adjacent pair of test vectors characterized by having a signal transition for more than one of a multitude of input signals of the circuit at a time, i.e. non-robust transitions.

Table 3 lists an example of a compact test vector set for good circuit 400A that eliminates the non-robust transitions found in table 2 but still includes all robust transitions. In other words, the multitude of compact test vectors does not include an adjacent pair of test vectors characterized by having a signal transition for more than one of a multitude of input signals of good circuit 400A at a time, i.e. non-robust transitions. The column designations are the same for table 3 as for table 2 but the number of test vectors enumerated in table 3 are 17 test vectors, significantly less than the number of 24 test vectors enumerated in table 2. In other words, the multitude of compact test vectors is enumerated by a number, e.g. 17 that is smaller than the number, e.g. 24 that enumerates the multitude of non-compact of test vectors.

TABLE 3

| Vector number | Input A1 | Input A2 |
|---|---|---|
| 1 | 0 | 0 |
| 2 | 0 | 0 |
| 3 | 1 | 0 |
| 4 | 1 | 0 |
| 5 | 1 | 1 |
| 6 | 1 | 1 |
| 7 | 0 | 1 |
| 8 | 0 | 1 |
| 9 | 1 | 1 |
| 10 | 1 | 1 |
| 11 | 1 | 0 |
| 12 | 1 | 0 |
| 13 | 0 | 0 |
| 14 | 0 | 0 |
| 15 | 0 | 1 |
| 16 | 0 | 1 |
| 17 | 0 | 0 |

Reducing the length of the test vector set improves computation time for each combination of defect chosen for circuit characterization. Further, it will be shown that only one compact test vector set is needed to perform cell-aware defect characterization for both static and dynamic defects in only one computation, reducing computation resources even more compared to known techniques using the non-compacted test vectors in two computations - for detecting static defects in one computation and for detecting dynamic defects in another computation. It will be shown below that the one compact test vector set is sufficient to detect both static and dynamic defects in one computation pass.

The compact test vector set listed in table 3 may be generated as follows. It is understood that the un-compact test vector set listed in table 2 may be divided into sequential 3-tuples of three immediately adjacent sequential test vectors such as vector numbers (1, 2, 3), (4, 5, 6), -, (22, 23, 24). The first test vector in each 3-tuple of sequential test vectors represents a stabilization time interval as described above, such as vector numbers 1, 4, -, 22. The second and third sequential test vector in each 3-tuple of sequential test vectors, such as vector numbers (2, 3), (5, 6), -, (23, 24) represent the pair of immediately adjacent test vectors associated with a robust transition at output X.

The compact test vector set listed in table 3 may be generated by selecting any one of the sequential 3-tuples of three immediately adjacent sequential test vectors in the non-compact test vector set listed in table 2, for example, by selecting vector numbers (4, 5, 6) to be the first sequential test vectors in the compact test vector set, i.e. vector numbers (1, 2, 3) in the compact test vector set. Then, select any other sequential 3-tuple of three immediately adjacent sequential test vectors in the non-compact test vector set listed in table 2 that starts with the same test vector elements as the test vector elements in the very last test vector of the partially generated compact test vector set, such as vector numbers (13, 14, 15) from table 2 that start with test vector elements 1, 0. Then the second and third sequential test vector in the currently selected 3-tuple of sequential test vectors of the non-compact test vector set, such as vector numbers (14, 15) are appended to the compact test vector set to form vector numbers (4, 5) of the compact test vector set as listed in table 3.

It is noted that the test vector elements 1, 0 are "reused," so to speak, by overlapping the earlier selected sequential 3-tuple of three immediately adjacent sequential test vectors with the next selected sequential 3-tuple of three immediately adjacent sequential test vectors. The above most recent selection procedure is repeated until all the sequential 3-tuples of three immediately adjacent sequential test vectors in the non-compact test vector set listed in table 2 have been used resulting in the compact test vector set listed in table 3.

It is noted that the compact test vector set listed in table 3 includes all robust transitions and provides stabilization periods for better characterization, but the compact test vector set does not include non-robust transitions. In other words, the multitude of compact test vectors includes every combination of an adjacent pair of test vectors characterized by having a signal transition for only one input of a plurality of input signals of the circuit at a time, i.e. every combination of robust transitions.

Figure 6:
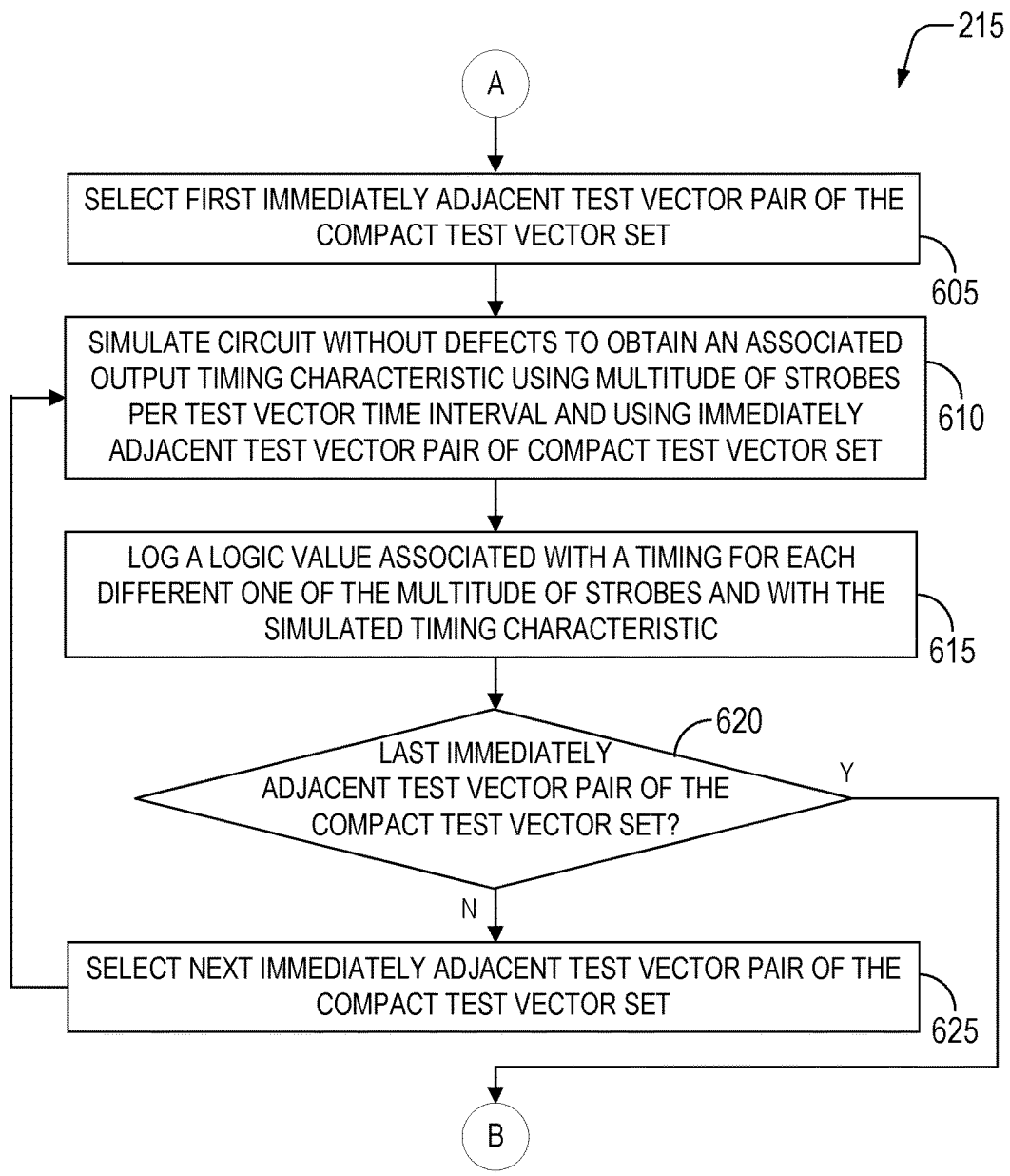
FIG. 6 depicts an exemplary flowchart for the step of simulating the good circuit as depicted in FIG. 2, in accordance with one embodiment of the present invention.

FIG. 6 depicts an exemplary flowchart for the step of simulating 215 good circuit 400A as depicted in FIG. 2, in accordance with one embodiment of the present invention. The step of simulating 215 good circuit 400A includes selecting 605 the first immediately adjacent test vector pair of the compact test vector set that enables the first transition, e.g. vector numbers (2, 3) from table 3. Optionally, the very first vector, i.e. vector number (1) from table 3 may be selected ahead of vector numbers (2, 3) to provide stabilization time for good circuit 400A as described above.

Then the SPICE testbench simulates 610 good circuit 400A without defects to obtain an associated output timing characteristic using the multitude of strobes S0-S9 per test vector time interval 515 and using the selected immediately adjacent test vector pair of the compact test vector set, e.g. vector numbers (2, 3) from table 3, or optionally selecting the first three vector numbers (1, 2, 3) from table 3.

Figure 7:
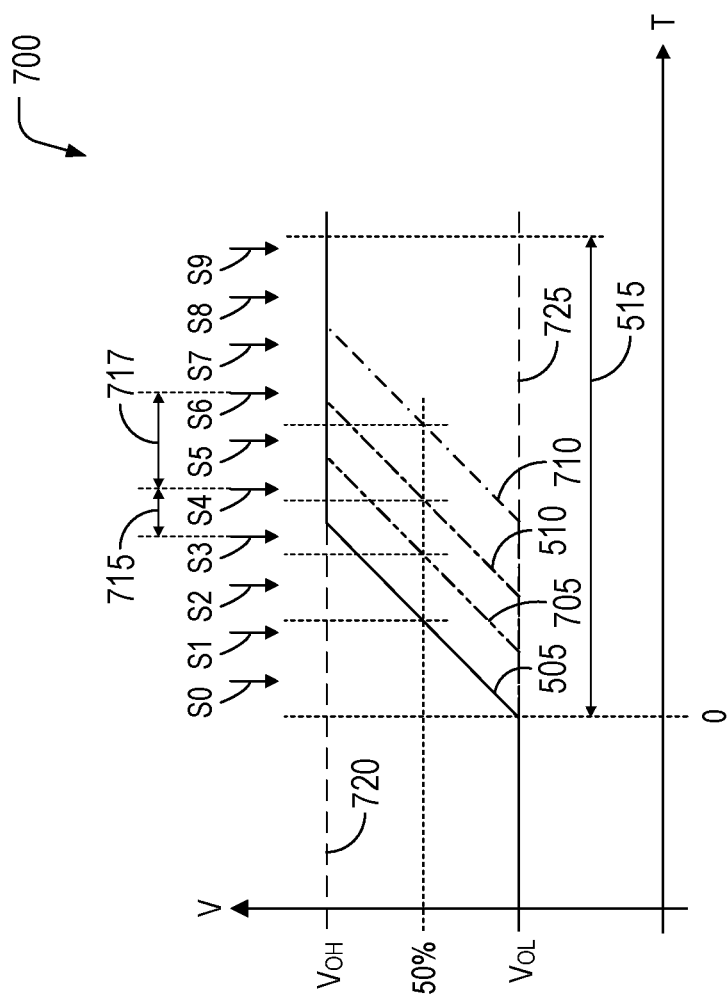
FIG. 7 depicts a simplified exemplary timing diagram for the simulated timing characteristics of the good circuit and the defect-injected circuits depicted respectively in FIGS. 4A-4C, in accordance with one embodiment of the present invention.

FIG. 7 depicts a simplified exemplary timing diagram for the simulated timing characteristics 700 of the good circuit 400A and the defect-injected circuits 400B, 400C depicted respectively in FIGS. 4A-4C, in accordance with one embodiment of the present invention. Simulated timing characteristics 700 includes the same timing definitions and waveforms as depicted in FIG. 5 with the following exceptions. As a matter of example to and to more easily explain the embodiments, simulated timing characteristics 700 provides details associated with the second test vector of the test vector pair responsible for a positive going transition from $V_{OL}$ to $V_{OH}$ of output X of good circuit 400A and defect-injected circuits 400B.

However, it is understood that the first pair of selected test vectors may or may not produce a positive transition or may not produce a transition at all such as in the example of the first three vector numbers (1, 2, 3) from table 3 operating on good circuit 400A. One must jump ahead to select vector numbers (4, 5) from table 3 to obtain a positive going transition on output X. Nevertheless, the vector pairs responsible for types of transitions or non-transitions other than the positive transition, such as a negative going transitions, will be understood by analogy to the positive going transition by those skilled in the art. Accordingly, simulated timing characteristics 700 includes, as an example, output timing characteristic 510 of output X of good circuit 400A.

Referring again to FIGS. 6-7, the step of simulating 215 good circuit 400A further includes logging 615 a logic value, i.e. 0 or 1, associated with a strobe timing for each different one of the multitude of strobes S0-S9 and with simulated output timing characteristic 510 as listed in Table 4 in the row labelled at the left as "good". Strobe timing may be referenced to the beginning of the vector time interval 515 merely to better explain the embodiments. It is observed that output timing characteristic 510 remains below the 50% logic transition threshold during the interval between the beginning of the vector time interval 515 and during S0-S3 Accordingly, the logical value logged for simulated output timing characteristic 510 during S0-S3 is logic 0. The logical value logged for simulated output timing characteristic 510 during S4-S9 is logic 1 because then output timing characteristic 510 rises above the 50% logic transition threshold.

TABLE 4

| | Strobe identification | | | | | | | | | |
|---|---|---|---|---|---|---|---|---|---|---|
| | S0 | S1 | S2 | S3 | S4 | S5 | S6 | S7 | S8 | S9 |
| Strobe timing (ns) | 3 | 7 | 11 | 15 | 19 | 23 | 27 | 31 | 35 | 39 |
| Stuck at 1 | 1 | 1 | 1 | 1 | 1 | 1 | 1 | 1 | 1 | 1 |
| Fast | 0 | 0 | 0 | 1 | 1 | 1 | 1 | 1 | 1 | 1 |
| Good | 0 | 0 | 0 | 0 | 1 | 1 | 1 | 1 | 1 | 1 |
| Slow | 0 | 0 | 0 | 0 | 0 | 0 | 1 | 1 | 1 | 1 |
| Stuck at 0 | 0 | 0 | 0 | 0 | 0 | 0 | 0 | 0 | 0 | 0 |

Next the step of simulating 215 good circuit 400A determines if the selected immediately adjacent test vector pair of the compact test vector set is the last one of the multitude of immediately adjacent test vector pairs. If the selected immediately adjacent test vector pair of the compact test vector set is not the last one of the multitude of immediately adjacent test vector pairs, then the next immediately adjacent test vector pair that produces of the compact test vector set may be selected 625 and the simulating 610, logging 615, and selecting 625 may be repeated until the last one of the multitude of immediately adjacent test vector pairs has been simulated 610 and results logged 615.

It is understood that in an alternative embodiment, the selection process for test vectors may setup the input timing waveform for the SPICE transistor level simulation 610 in one continuous pass using the entire list of compact test vectors in table 3 to generate a continuous input timing waveform with a multitude of transitions for each of input A1 and input A2 of good circuit 400A. It is further understood that ten logical data values associated with strobes S0-S9, such as one of the logical data rows in table 4, may be logged for each test vector in one embodiment or for each immediately adjacent test vector pair of the compact test vector set in an alternative embodiment.

Figure 8:
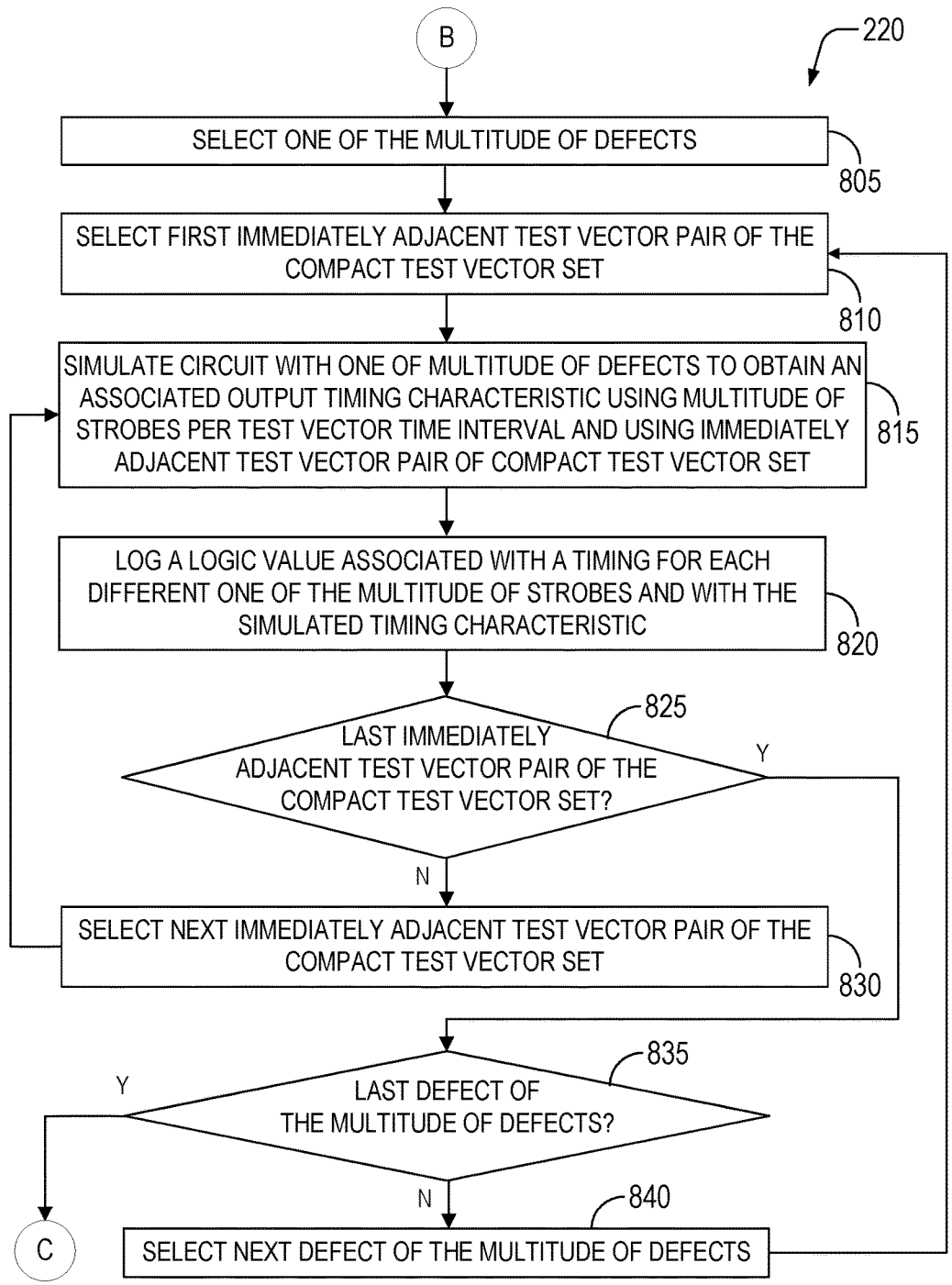
FIG. 8 depicts an exemplary flowchart for the step of simulating a multitude of defect-injected circuits as depicted in FIGS. 2 and 4B-4C, in accordance with one embodiment of the present invention.

FIG. 8 depicts an exemplary flowchart for the step of simulating 220 a multitude of defect-injected circuits 400B, 400C as depicted in FIGS. 2 and 4B-4C, in accordance with one embodiment of the present invention. The step of simulating 220 multitude of defect-injected circuits 400B, 400C includes selecting 805 one of the multitude of defects to simulate such as selecting defect-injected circuit 400B with short 435 type of defect. The multitude of defects may include some or all of the defects listed in table 1 for some or all of the elements included in good circuit 400B. Referring simultaneously to FIGS. 6 and 8, the next few steps select 810 first immediately adjacent test vector pair, simulate 815, log 820, determine if 825 the selected immediately adjacent test vector pair of the compact test vector set is the last, and select 830 next immediately adjacent test vector pair are similar to the respective steps 605, 610, 615, 620, and 625 described above in reference to FIG. 6 except for the following.

When the last of the test vector pairs for a selected defect have been simulated, the step of simulating 220 multitude of defect-injected circuits 400B, 400C includes determining if 835 the last of the multitude of defects has been selected and if not, the next defect of the multitude of defects is selected 840 and the steps 810-830 are repeated until the last of the defects have been simulated. Again, it is understood that in an alternative embodiment, the selection process for test vectors may setup the input timing waveform for the SPICE transistor level simulation 815 in one continuous pass using the entire list of compact test vectors in table 3 to generate a continuous input timing waveform with a multitude of transitions for each of input A1 and input A2 of defect-injected circuits 400B, 400C.

Referring again to FIGS. 7-8 and table 4, simulated timing characteristics 700 includes the same timing definitions and waveforms as depicted in FIG. 5 with the following further exceptions. Simulated timing characteristics 700 includes an output timing characteristic 705 associated with output X of defect-injected circuit 400B. During the log 820 step a multitude of logic values may be logged as listed in the row identified as "Fast" in table 4 because the rising transition is earlier and reaches a logic 1 value by strobe S3 at the 15 ns strobe timing, instead of by strobe 4 at the 19 ns strobe timing as indicated for good circuit 400A. In other words, the multitude of strobes S0-S9 includes a strobe S4 associated with a normal transition of the output timing characteristic 510 of output X of good circuit 400A and a strobe S3 associated with an earlier error transition of the output timing characteristic 705 of output X of defect-injected circuit 400B.

Further, because of the use of the multitude of strobes, the simulation 815 may determine a difference in time 715 of 4 ns associated with multitude of strobes S3, S4, output timing characteristic 510, and output timing characteristic 705. Difference in time 715 may be a very useful tool as will be explained below but is not obtainable using known cell-aware defect characterization techniques that may use only one strobe during simulation.

Simulated timing characteristics 700 includes an output timing characteristic 710 associated with output X of defect-injected circuit 400C. During the log 820 step a multitude of logic values may be logged as listed in the row identified as "Slow" in table 4 because the rising transition is delayed and reaches a logic 1 value by strobe S6 at the 27 ns strobe timing, instead of by strobe 4 at the 19 ns strobe timing as indicated for good circuit 400A. In this example the simulation 815 may determine a difference in time 717 of 8 ns associated with multitude of strobes S4, S6, output timing characteristic 510, and output timing characteristic 710 for defect-injected circuit 400C.

If a the resistance value of a defect is extreme enough, i.e. lower or higher than a defect resistance that would allow the circuit to generate a transition at the output, then a static defect may occur. An output timing characteristic 720 is an example of a static defect associated with a "stuck at 1" defect and logged 820 as logic 1 for all S0-S9. An output timing characteristic 725 is an example of a static defect associated with a "stuck at 0" defect and logged 820 as logic 0 for all S0-S9.

Figure 9:
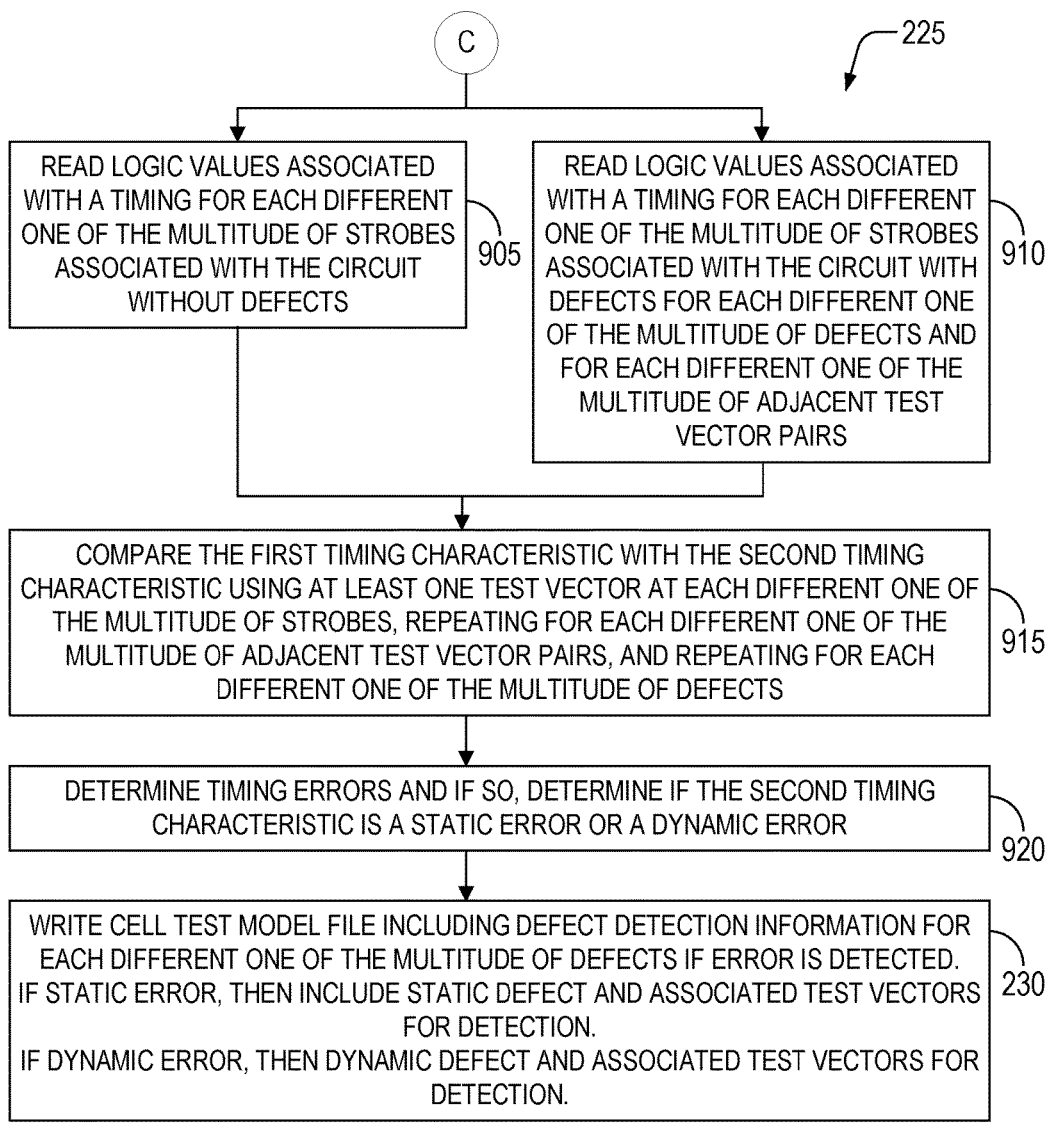
FIG. 9 depicts an exemplary flowchart for the step of identify an association between at least one test vector and at least one defect as depicted in FIG. 2, in accordance with one embodiment of the present invention.

FIG. 9 depicts an exemplary flowchart for the step of identifying 225 an association between the at least one test vector and at least one defect as depicted in FIG. 2, in accordance with one embodiment of the present invention. Referring simultaneously to FIGS. 4A-4B, 7 and 9, the step of identifying 225 an association may include reading 905 the logic values, i.e. 0 or 1 associated with a strobe timing for each different one of the multitude of strobes S0-S9 associated with good circuit 400A without defects such as listed in the row identified as "good" in table 4.

In parallel or in any order with reading 905, the step of identifying 225 an association may further include reading 910 the logic values, i.e. 0 or 1, associated with a strobe timing for each different one of the multitude of strobes S0-S9 associated with defect-injected circuits 400B, 400C, for each different one of the multitude of defects, respectively short 435, open 440, such as listed in the rows identified respectively as "fast", "slow" in table 4, and for each different one of the multitude of adjacent test vector pairs of the set of compact test vectors as listed in table 3.

The above logical defect data may be enumerated by 10 strobes×2 defects×8 robust immediately adjacent test vector pairs totaling 160 logical data entries. Alternatively in another embodiment, the data may be logged for each test vector instead of by pairs of test vectors and the logical defect data may be enumerated by 10 strobes×2 defects×17 test vectors of the compact test vector set totaling 340 logical data entries. As described above, the number of defects when fully enumerated for a full cell-aware defect characterization depends mostly on the transistor count in the good circuit and may create a much larger logical data set compared to just the two defect type examples described for defect-injected circuits 400B, 400C.

Next, output timing characteristic 510 of good circuit 400A may be compared 915 with output timing characteristic 705 or 710 of respective defect-injected circuits 400B, 400C using at least one test vector of the set of compact test vectors at each different one of the multitude of strobes S0-S9, repeating for each different one of the multitude of adjacent test vector pairs or for every test vector, and repeating for each different one of the multitude of defects listed in table 1 and associated with every circuit element prone to defects.

Figure 10:
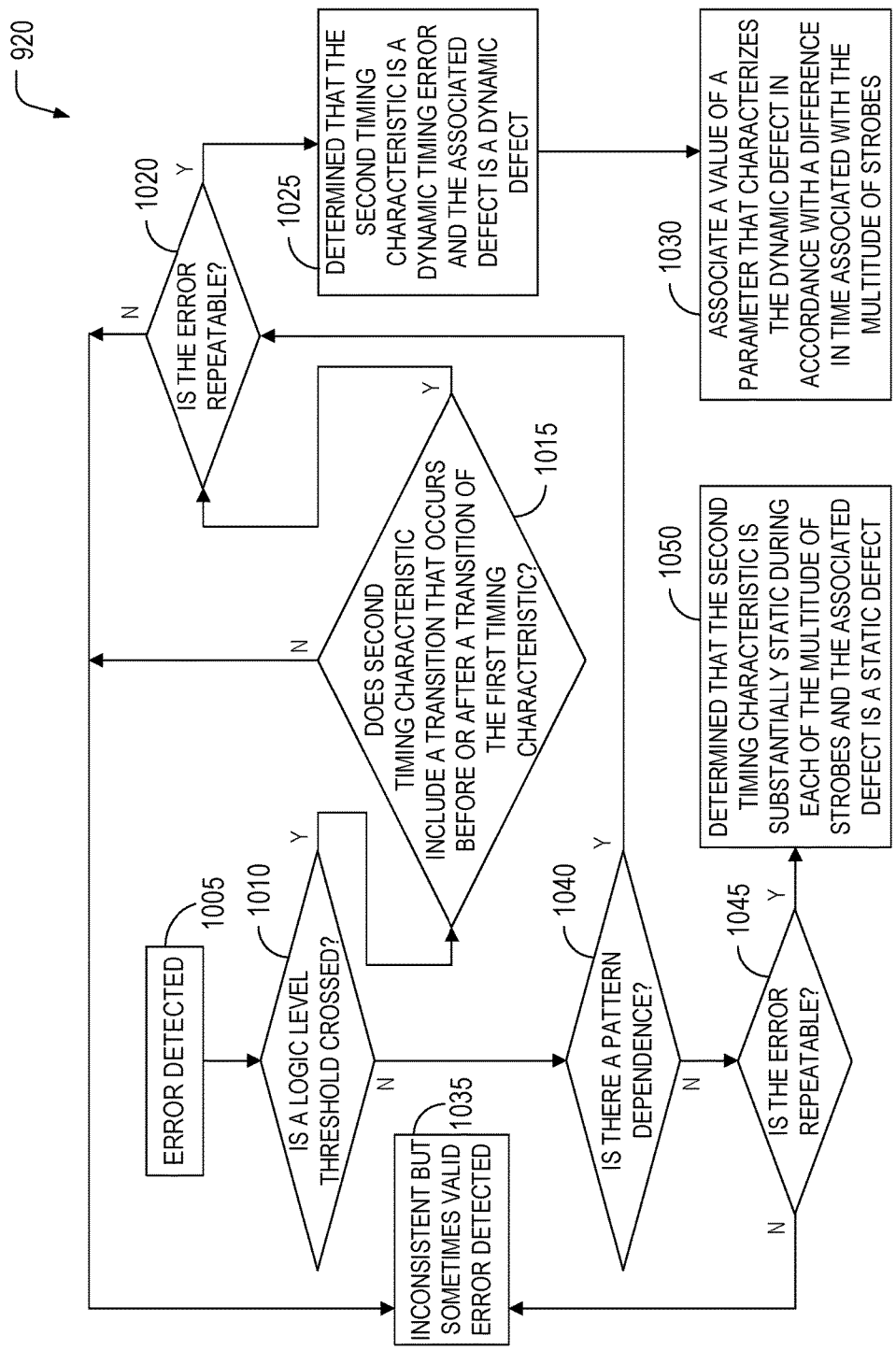
FIG. 10 depicts an exemplary flowchart for the step of determining if the output timing characteristic is an error and what kind of error as depicted in FIG. 9, in accordance with one embodiment of the present invention.

Next, determine if 920 output timing characteristic 705 or 710 is a timing error, e.g. the logic values associated with strobes S0-S9 for the defect-injected circuit do not match the logic values associated with strobes S0-S9 for the good circuit and if so, then determine if output timing characteristic 705 or 710 is a static error or a dynamic error. FIG. 10 depicts an exemplary flowchart for the step of determining 920 if the output timing characteristic 705 or 710 is an error and what kind of error as depicted in FIG. 9, in accordance with one embodiment of the present invention. Referring simultaneously to FIGS. 4B-4C, 7 and 10, and table 4, the step of determining 920 may include detecting 1005 the error in output timing characteristic 705 or 710, and then determining if 1010 a logic level threshold, such as 50%, is crossed and if so, determine if 1015 output timing characteristic 705 or 710 include a transition that occurs before or after a transition of the output timing characteristic 510. If output timing characteristic 705 or 710 does include a transition that occurs before or after a transition of the output timing characteristic 510 then determine if 1020 the timing error in output timing characteristic 705 or 710 is repeatable. In other words, step 1015 determines if the output timing characteristic 710 includes a timing transition of output X for defect injected circuit 400C that occurs after a timing transition of the output timing characteristic 510 of good circuit 400A or determines if the output timing characteristic 705 includes a timing transition of output X for defect injected circuit 400B that occurs before a timing transition of the output timing characteristic 510 of good circuit 400A.

If the timing error in output timing characteristic 705 or 710 is repeatable, then it is determined 1025 that the timing error type in output timing characteristic 705 or 710 is a dynamic timing error and the associated defect, e.g. short 435 or open 440 respectively, is a dynamic type defect. Next, associate 1030 a value, e.g. 100 K ohms, of a parameter, e.g. resistance, that characterizes the dynamic defect, e.g. open 440, in accordance with a difference in time, e.g. difference in time 717, associated with the multitude of strobes S4, S6. The difference in time, e.g. difference in time 717, is equal to the difference between a strobe timing associated with the strobe S4, e.g. 19 ns (from table 4), and a strobe timing associated with the strobe S6, e.g. 27 ns. Therefore, the difference in time, e.g. difference in time 717, is equal to 27−19=8 ns.

Assume another example where the value of the resistance for open 440 is increased to 200 K ohms and it is determined using the embodiments described above that the transition of output timing characteristic 710 is further delayed so as to rise above the 50% logic threshold just before strobe S8. Then difference in time 717, is equal to 35−19=16 ns, thereby establishing a model between the degree or severity of the defect and the timing behavior or the circuit. Therefore, using the embodiments described herein, it is now possible to have much more accurate information to help diagnose manufacturing defects than is possible using single strobe cell-aware defect characterization.

If it is determined at step 1010 that a logic level threshold, such as 50%, is not crossed, then it is determined if 1040 there is a pattern dependence, i.e. is the output timing characteristic 705 or 710 result change in accordance with the input vector of the compact vector set. If there is no pattern dependence, i.e. the output timing characteristic 705 or 710 result doe not change in accordance with the input vector of the compact vector set, then determine if 1045 the timing error in output timing characteristic 705 or 710 is repeatable. If the timing error is repeatable, then it is determined 1050 that the output timing characteristic 705 or 710 is substantially static during each of the multitude of strobes S0-S9 and the associated defect is a static defect type. In this context, substantially static means the output timing characteristic for output X either never rose above or never dropped below the logic threshold level extracted from the Liberty file during any of the multitude of strobes S0-S9. Accordingly, the method identifies, during a single pass through the computer-implemented method and in accordance with the multitude of compact test vectors, a timing error and/or defect type that is a static error and/or a dynamic error, which reduces computation time and/or resources compared to known methods that use one characterization pass just to identify static errors and another separate characterization pass just to identify dynamic errors.

Static defects may be further classified into two types of static defect types, "stuck at 1" and "stuck at 0." Simulated timing characteristics 700 further includes output timing characteristic 720, which may be classified as and/or associated with a "stuck at 1" type of static defect and output timing characteristic 725, which may be classified as and/or associated with a "stuck at 0" type of static defect. Table 4 indicates the logical values and strobe timing information for "stuck at 1" and "stuck at 0" type of static defects as logged by the above embodiments.

If it is determine at step 1015 that output timing characteristic 705 or 710 does not include a transition that occurs before or after a transition of the output timing characteristic 510, or if at either steps 1020 or 1045 it is determined the error in output timing characteristic 705, 710, 720, 725 is not repeatable, then the defect may be classified as being detected 1035 as an inconsistent but sometimes valid error.

Referring again to FIG. 9, after determining and classifying the timing defects, the step of identifying 225 an association may further include writing 230 to a cell test model (CTM) file and including defect detection information for each different one of the multitude of defects if timing errors are detected. If a static error is detected, then data associated with the static defect and associated test vectors for detecting the static defect may be included in the CTM file. If a dynamic error is detected, then data associated with the dynamic defect and associated test vectors for detecting the dynamic defect may be included in the CTM file. The CTM file may be used as an input to another logic simulation tool used for simulating the logic behavior of a large multitude of standard cells or even an entire IC at a time that are subject to the manufacturing defects characterized by the embodiments described above.

An example of a CTM file is provided below with line numbers for reference only preceding each line of the file.

```
 1. - Cell: SEP_AN2_1
 2.   InSignals: [A1, A2]
 3.   OutSignals: [X]
 4.   Defects:
 5.   - Id: D2
 6.     Type: short
 7.     Description: Cg99 VBP VSS 1 status=undet
 8.     Attributes:
 9.     - Class: UD
10. ......
11.   - Id: D464
12.     Type: short
13.     Description: XMNA1 I1:F88 VBN 10000.0 status=dynamic_det small_delay=30.0ps
14.     Attributes:
15.     - Class: DT
16.     - DetEquivalent: D26
17.     - Behavior: small_delay
18. ......
19.   - Id: D595
20.     Type: open
21.     Description: R_I1N1_F86_XMNA1 I1N1:F86_XMNA1 I1N1:F86 100000.0 status=dynamic_det
22.     Attributes:
23.     - Class: DT
24.     - DetEquivalent: D15
25.     - Behavior: delay
26.   Detections:
27.   - [Table, Static]
28.   - [A1,A2, X, D3,D6,D28,D37,D49,D51,D53,D94,D184]
29.   - [0, 0, 0, 0, 0, 1, 0, 1, 1, 1, 1, 1]
```

```
30.  - [0, 1, 0, 0, 0, 1, 1, 1, 0, 1, 0, 0]
31.  - [1, 0, 0, 0, 1, 1, 0, 0, 1, 1, 0, 0]
32.  - [1, 1, 1, 1, 0, 0, 0, 1, 1, 1, 1, 0]
33.  - [Table, Dynamic]
34.  - [A1,A2, X, D1,D7,D15,D26,D38,D244,D324,D364,
       D484,D666,D686,D696]
35.  - [R, 1, R, 0, 0, 1, 0, 0, 0, 1, 1, 1, 1, 1, 0]
36.  - [1, R, R, 0, 0, 1, 0, 1, 1, 0, 1, 1, 0, 1, 1]
37.  - [F, 1, F, 0, 1, 0, 1, 1, 0, 0, 1, 0, 1, 1, 0]
38.  - [1, F, F, 1, 0, 0, 1, 1, 0, 0, 0, 1, 0, 1, 1]
```

Referring simultaneously to the CTM file listing above and FIGS. 4B-4C, D464 corresponds to short 435 and D595 corresponds to open 440. For example, the CTM file listing above indicates defect D595 is an open type defect at line number 20 and corresponding to 100 K ohms responsible for a dynamic type timing error at line number 21. The CTM file listing above further indicates defect D464 is a dynamic defect detected by vectors "A1=F, A2=1" and "A1=1, A2=F", as indicated at line numbers 37 and 38 respectively. Defect 595 is detected by vectors "A1=R, A2=1" and "A1=1, A2=R", as indicated at line numbers 35 and 36.

Figure 11:
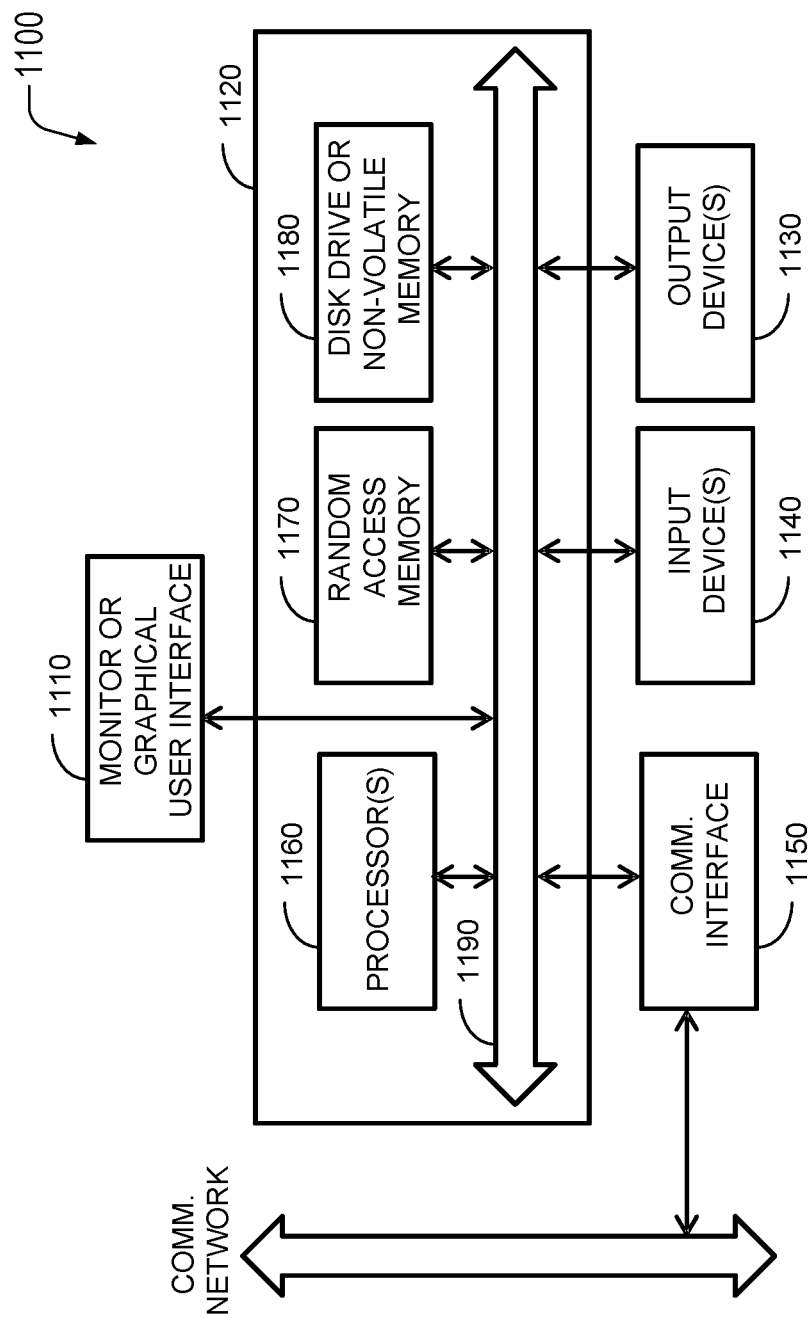
FIG. 11 depicts an example block diagram of a computer system that may incorporate embodiments of the present invention.

FIG. 11 is an example block diagram of a computer system 1100 that may incorporate embodiments of the present invention. FIG. 11 is merely illustrative of an embodiment incorporating the present invention and does not limit the scope of the invention as recited in the claims. One of ordinary skill in the art would recognize other variations, modifications, and alternatives. In one embodiment, computer system 1100 typically includes a monitor 1110, a computer 1120, user output devices 1130, user input devices 1140, communications interface 1150, and the like.

As depicted in FIG. 11, computer 1120 may include a processor(s) 1160 that communicates with a number of peripheral devices via a bus subsystem 1190. These peripheral devices may include user output devices 1130, user input devices 1140, communications interface 1150, and a storage subsystem, and such as random access memory (RAM) 1170 and disk drive 1180.

User input devices 1140 include all possible types of devices and mechanisms for inputting information to computer 1120. These may include a keyboard, a keypad, a touch screen incorporated into the display, audio input devices such as voice recognition systems, microphones, and other types of input devices. In various embodiments, user input devices 1130 are typically embodied as a computer mouse, a trackball, a track pad, a joystick, wireless remote, drawing tablet, voice command system, eye tracking system, and the like. User input devices 1140 typically allow a user to select objects, icons, text and the like that appear on the monitor 1110 via a command such as a click of a button or the like.

User output devices 1140 include all possible types of devices and mechanisms for outputting information from computer 1120. These may include a display (e.g., monitor 1110), non-visual displays such as audio output devices, etc.

Communications interface 1150 provides an interface to other communication networks and devices. Communications interface 1150 may serve as an interface for receiving data from and transmitting data to other systems. Embodiments of communications interface 1150 typically include an Ethernet card, a modem (telephone, satellite, cable, ISDN), (asynchronous) digital subscriber line (DSL) unit, FireWire interface, USB interface, and the like. For example, communications interface 1150 may be coupled to a computer network, to a FireWire bus, or the like. In other embodiments, communications interfaces 1150 may be physically integrated on the motherboard of computer 1120, and may be a software program, such as soft DSL, or the like.

In various embodiments, computer system 1100 may also include software that enables communications over a network such as the HTTP, TCP/IP, RTP/RTSP protocols, and the like. In alternative embodiments of the present invention, other communications software and transfer protocols may also be used, for example IPX, UDP or the like. In some embodiments, computer 1120 includes one or more Xeon microprocessors from Intel as processor(s) 1160. Further, one embodiment, computer 1120 includes a UNIX-based operating system.

RAM 1170 and disk drive 1180 are examples of tangible media configured to store data such as embodiments of the present invention, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. RAM 1170 and disk drive 1180 may be configured to store the basic programming and data constructs that provide the functionality of the present invention.

Software code modules and instructions that provide the functionality of the present invention may be stored in RAM 1170 and disk drive 1180. These software modules may be executed by processor(s) 1160. RAM 1170 and disk drive 1180 may also provide a repository for storing data used in accordance with the present invention.

RAM 1170 and disk drive 1180 may include a number of memories including a main random access memory (RAM) for storage of instructions and data during program execution and a read only memory (ROM) in which fixed non-transitory instructions are stored. RAM 1170 and disk drive 1180 may include a file storage subsystem providing persistent (non-volatile) storage for program and data files. RAM 1170 and disk drive 1180 may also include removable storage systems, such as removable flash memory.

Bus subsystem 1190 provides a mechanism for letting the various components and subsystems of computer 1120 communicate with each other as intended. Although bus subsystem 1190 is depicted schematically as a single bus, alternative embodiments of the bus subsystem may utilize multiple busses.

FIG. 11 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

The above descriptions of embodiments of the present invention are illustrative and not limitative. In addition, similar principles as described corresponding to latches and/or flops can be applied to other sequential logic circuit elements. Other modifications and variations will be apparent to those skilled in the art and are intended to fall within the scope of the appended claims.

What is claimed is:

1. A computer-implemented method for characterizing a circuit, the method comprising:
   receiving, by the computer, data representative of the circuit and at least one defect of the circuit;
   simulating, using the computer, the circuit to obtain a first timing characteristic;
   simulating, using the computer, the circuit with the at least one defect to obtain a second timing characteristic; and
   identifying, using the computer, an association between at least one test vector and the at least one defect in accordance with the first timing characteristic, the second timing characteristic, and a plurality of strobes applied during a first time interval associated with the at least one test vector, when the computer is invoked to characterize the circuit, wherein identifying further includes determining if the second timing characteristic includes a first transition that occurs after a second transition of the first timing characteristic.

2. The computer-implemented method of claim 1 further comprising comparing the first timing characteristic with the second timing characteristic using the at least one test vector.

3. The computer-implemented method of claim 1, wherein identifying further includes determining if the second timing characteristic is substantially static during each of the plurality of strobes.

4. The computer-implemented method of claim 1, wherein identifying further includes determining if the second timing characteristic includes a first transition that occurs before a second transition of the first timing characteristic.

5. The computer-implemented method of claim 1, wherein identifying further includes determining if the second timing characteristic is a timing error.

6. The computer-implemented method of claim 1, wherein identifying further includes determining if the second timing characteristic is a static error or a dynamic error when the second timing characteristic is determined to be a timing error.

7. The computer-implemented method of claim 1, wherein receiving includes generating, using the computer, the data representative of the at least one defect in accordance with data representative of at least one element of the circuit.

8. The computer-implemented method of claim 1, wherein the circuit is one cell of a library of a plurality of cells.

9. The computer-implemented method of claim 1, wherein identifying further includes determining a difference in time associated with the plurality of strobes, the first timing characteristic, and the second timing characteristic.

10. The computer-implemented method of claim 1, wherein the plurality of strobes includes a first strobe associated with a first transition of the first timing characteristic and a second strobe associated with a second transition of the second timing characteristic.

11. The computer-implemented method of claim 1, wherein identifying further includes associating a value of a parameter that characterizes the at least one defect in accordance with a difference in time associated with the plurality of strobes.

12. The computer-implemented method of claim 11, wherein the difference in time is equal to the difference between a first time associated with the first strobe and a second time associated with the second strobe.

13. The computer-implemented method of claim 1, wherein receiving includes generating a first plurality of test vectors, wherein the at least one test vector is included in the first plurality of test vectors enumerated by a first number that is smaller than a second number that enumerates a second plurality of test vectors including at least one adjacent pair of test vectors characterized by having a signal transition for more than one of a plurality of input signals of the circuit at a time.

14. The computer-implemented method of claim 13, wherein the first plurality of test vectors includes every combination of an adjacent pair of test vectors characterized by having a signal transition for one input of a plurality of input signals of the circuit at a time.

15. The computer-implemented method of claim 13, wherein the first plurality of test vectors does not include an adjacent pair of test vectors characterized by having a signal transition for more than one of a plurality of input signals of the circuit at a time.

16. The computer-implemented method of claim 1, wherein identifying further includes identifying, during a single pass through the computer-implemented method in accordance with a first plurality of test vectors that include the at least one test vector, an error selected from the group consisting of a static error and a dynamic error.

17. A computer-implemented method for characterizing a circuit, the method comprising:
receiving, by the computer, data representative of the circuit and at least one defect of the circuit;
simulating, using the computer, the circuit to obtain a first timing characteristic
simulating, using the computer, the circuit with the at least one defect to obtain a second timing characteristic; and
identifying, using the computer, an association between at least one test vector and the at least one defect in accordance with the first timing characteristic, the second timing characteristic, and a plurality of strobes applied during a first time interval associated with the at least one test vector, when the computer is invoked to characterize the circuit, wherein identifying further includes determining if the second timing characteristic includes a first transition that occurs before a second transition of the first timing characteristic.

18. The computer-implemented method of claim 17 further comprising comparing the first timing characteristic with the second timing characteristic using the at least one test vector.

19. The computer-implemented method of claim 17, wherein identifying further includes determining if the second timing characteristic is substantially static during each of the plurality of strobes.

20. The computer-implemented method of claim 17, wherein identifying further includes determining if the second timing characteristic includes a first transition that occurs after a second transition of the first timing characteristic.

21. The computer-implemented method of claim 17, wherein identifying further includes determining if the second timing characteristic is a timing error.

22. The computer-implemented method of claim 17, wherein identifying further includes determining if the second timing characteristic is a static error or a dynamic error when the second timing characteristic is determined to be a timing error.

23. The computer-implemented method of claim 17, wherein receiving includes generating, using the computer, the data representative of the at least one defect in accordance with data representative of at least one element of the circuit.

24. The computer-implemented method of claim 17, wherein the circuit is one cell of a library of a plurality of cells.

25. The computer-implemented method of claim 17, wherein identifying further includes determining a difference in time associated with the plurality of strobes, the first timing characteristic, and the second timing characteristic.

26. The computer-implemented method of claim 17, wherein the plurality of strobes includes a first strobe associated with a first transition of the first timing characteristic and a second strobe associated with a second transition of the second timing characteristic.

27. The computer-implemented method of claim 17, wherein identifying further includes associating a value of a parameter that characterizes the at least one defect in accordance with a difference in time associated with the plurality of strobes.

28. The computer-implemented method of claim 27, wherein the difference in time is equal to the difference between a first time associated with the first strobe and a second time associated with the second strobe.

29. The computer-implemented method of claim 17, wherein receiving includes generating a first plurality of test vectors, wherein the at least one test vector is included in the first plurality of test vectors enumerated by a first number that is smaller than a second number that enumerates a second plurality of test vectors including at least one adjacent pair of test vectors characterized by having a signal transition for more than one of a plurality of input signals of the circuit at a time.

30. The computer-implemented method of claim 29, wherein the first plurality of test vectors includes every combination of an adjacent pair of test vectors characterized by having a signal transition for one input of a plurality of input signals of the circuit at a time.

31. The computer-implemented method of claim 29, wherein the first plurality of test vectors does not include an adjacent pair of test vectors characterized by having a signal transition for more than one of a plurality of input signals of the circuit at a time.

32. The computer-implemented method of claim 17, wherein identifying further includes identifying, during a single pass through the computer-implemented method in accordance with a first plurality of test vectors that include the at least one test vector, an error selected from the group consisting of a static error and a dynamic error.

33. A computer system operative to:
receive data representative of the circuit and at least one defect of the circuit;
simulate the circuit to obtain a first timing characteristic;
simulate the circuit with the at least one defect to obtain a second timing characteristic; and
identify an association between at least one test vector and the at least one defect in accordance with the first timing characteristic, the second timing characteristic, and a plurality of strobes applied during a first time interval associated with the at least one test vector, when the computer system is invoked to characterize the circuit, wherein identifying further includes determining if the second timing characteristic includes a first transition that occurs after a second transition of the first timing characteristic.

34. The computer system of claim 33 further operative to compare the first timing characteristic with the second timing characteristic using the at least one test vector.

35. The computer system of claim 33, wherein identifying further includes determining if the second timing characteristic is substantially static during each of the plurality of strobes.

36. The computer system of claim 33, wherein identifying further includes determining if the second timing characteristic includes a first transition that occurs before a second transition of the first timing characteristic.

37. The computer system of claim 33, wherein identifying further includes determining if the second timing characteristic is a timing error.

38. The computer system of claim 33, wherein identifying further includes determining if the second timing characteristic is a static error or a dynamic error when the second timing characteristic is determined to be a timing error.

39. The computer system of claim 33, wherein receiving includes generating, using the computer, the data representative of the at least one defect in accordance with data representative of at least one element of the circuit.

40. The computer system of claim 33, wherein the circuit is one cell of a library of a plurality of cells.

41. The computer system of claim 33, wherein identifying further includes determining a difference in time associated with the plurality of strobes, the first timing characteristic, and the second timing characteristic.

42. The computer system of claim 33, wherein the plurality of strobes includes a first strobe associated with a first transition of the first timing characteristic and a second strobe associated with a second transition of the second timing characteristic.

43. The computer system of claim 33, wherein identifying further includes associating a value of a parameter that characterizes the at least one defect in accordance with a difference in time associated with the plurality of strobes.

44. The computer system of claim 43, wherein the difference in time is equal to the difference between a first time associated with the first strobe and a second time associated with the second strobe.

45. The computer system of claim 33, wherein receiving includes generating a first plurality of test vectors, wherein the at least one test vector is included in the first plurality of test vectors enumerated by a first number that is smaller than a second number that enumerates a second plurality of test vectors including at least one adjacent pair of test vectors characterized by having a signal transition for more than one of a plurality of input signals of the circuit at a time.

46. The computer system of claim 45, wherein the first plurality of test vectors includes every combination of an adjacent pair of test vectors characterized by having a signal transition for one input of a plurality of input signals of the circuit at a time.

47. The computer system of claim 45, wherein the first plurality of test vectors does not include an adjacent pair of test vectors characterized by having a signal transition for more than one of a plurality of input signals of the circuit at a time.

48. The computer system of claim 33, wherein identifying further includes identifying, during a single pass through the computer-implemented method in accordance with a first plurality of test vectors that include the at least one test vector, an error selected from the group consisting of a static error and a dynamic error.

49. A computer system operative to:
receive data representative of the circuit and at least one defect of the circuit;
simulate the circuit to obtain a first timing characteristic;
simulate the circuit with the at least one defect to obtain a second timing characteristic; and
identify an association between at least one test vector and the at least one defect in accordance with the first timing characteristic, the second timing characteristic, and a plurality of strobes applied during a first time interval associated with the at least one test vector, when the computer system is invoked to characterize the circuit, wherein identifying further includes determining if the second timing characteristic includes a first transition that occurs before a second transition of the first timing characteristic.

50. The computer system of claim 49 further operative to compare the first timing characteristic with the second timing characteristic using the at least one test vector.

51. The computer system of claim 49, wherein identifying further includes determining if the second timing characteristic is substantially static during each of the plurality of strobes.

52. The computer system of claim 49, wherein identifying further includes determining if the second timing characteristic includes a first transition that occurs after a second transition of the first timing characteristic.

53. The computer system of claim 49, wherein identifying further includes determining if the second timing characteristic is a timing error.

54. The computer system of claim 49, wherein identifying further includes determining if the second timing characteristic is a static error or a dynamic error when the second timing characteristic is determined to be a timing error.

55. The computer system of claim 49, wherein receiving includes generating, using the computer, the data representative of the at least one defect in accordance with data representative of at least one element of the circuit.

56. The computer system of claim 49, wherein the circuit is one cell of a library of a plurality of cells.

57. The computer system of claim 49, wherein identifying further includes determining a difference in time associated with the plurality of strobes, the first timing characteristic, and the second timing characteristic.

* * * * *